United States Patent [19]

Kojima

[11] 4,258,121
[45] Mar. 24, 1981

[54] PHOTOPOLYMERIZABLE COMPOSITIONS

[75] Inventor: Teruo Kojima, Minami-ashigara, Japan

[73] Assignee: Fuji Photo Film Co., Ltd., Minami-ashigara, Japan

[21] Appl. No.: 127,627

[22] Filed: Mar. 6, 1980

[30] Foreign Application Priority Data

Mar. 6, 1979 [JP] Japan .................................. 54-25750

[51] Int. Cl.³ .............................................. G03C 1/68
[52] U.S. Cl. ............................... 430/281; 204/159.18; 204/159.19; 204/159.23; 430/283; 430/285; 430/286; 430/287; 430/288; 430/905; 430/908; 430/910; 430/920
[58] Field of Search ............... 430/281, 283, 285, 286, 430/287, 905, 908, 910, 920, 288; 204/159.18, 159.19, 159.23

[56] References Cited

U.S. PATENT DOCUMENTS

| | | | |
|---|---|---|---|
| 2,902,365 | 9/1959 | Martin | 430/281 |
| 2,927,022 | 3/1960 | Martin | 430/281 |
| 3,844,790 | 10/1974 | Chang et al. | 430/920 |
| 3,870,524 | 3/1975 | Watanabe et al. | 430/281 |
| 4,009,324 | 2/1977 | Freedman et al. | 204/159.23 |
| 4,052,367 | 10/1977 | Wilson | 430/281 |

Primary Examiner—Jack P. Brammer
Attorney, Agent, or Firm—Sughrue, Rothwell, Mion, Zinn and Macpeak

[57] ABSTRACT

A photopolymerizable composition comprising a monomer having at least two ethylenically unsaturated groups, which can be photopolymerized by actinic radiation, a photopolymerization initiator represented by the formula:

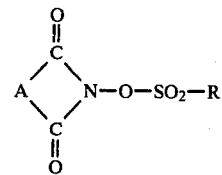

wherein A represents an arylene group, a substituted arylene group, an alkylene group, a substituted alkylene group, an alkenylene group, or a substituted alkenylene group and R represents an alkyl group, a substituted alkyl group, an aryl group or a substituted aryl group, and optionally a linear organic high molecular weight polymer and a sensitizer. The composition is useful for photosensitive layers of photosensitive printing plates, photoresists, etc.

33 Claims, No Drawings

PHOTOPOLYMERIZABLE COMPOSITIONS

BACKGROUND OF THE INVENTION

1. Field of the Invention

This invention relates to photopolymerizable compositions and, more particularly, to a photopolymerizable composition comprising an unsaturated monomer, a photopolymerization initiator, and, if necessary, a linear organic high molecular weight polymer and a sensitizer. In particular, the invention relates to photopolymerizable compositions useful for photosensitive layers of photosensitive printing plates, photoresists, etc.

2. Description of the Prior Art

A method of making image reproductions by photographic means using a photosensitive composition composed of a mixture of a polymerizable ethylenically unsaturated compound, a photopolymerization initiator, and, if necessary, a soluble polymer having film-forming ability, a thermal polymerization preventing agent, etc., is presently widely known. U.S. Pat. Nos. 2,927,022, and 2,902,356 disclose that a photosensitive composition of this type has the ability to be hardened and insolubilized by irradiation with light and hence hardened images of the photopolymerizable composition can be formed by providing a film or layer of the photopolymerizable composition, exposing the film or layer through a negative of the desired image to light, and then removing unexposed portions with a suitable solvent. As a matter of course, the photopolymerizable composition of this type is very useful for making printing plates or resists.

However, because a polymerizable ethylenically unsaturated compound is not sufficiently sensitive, photopolymerization initiators such as benzil, benzoin, benzoin ethyl ether, Michler's ketone, anthraquinone, acridine, phenazine, benzophenone, 2-ethylanthraquinone, etc., have been added to the compound to increase sensitivity. However, using these photopolymerization initiators, a long exposure time is required for hardening due to the low response of the photopolymerizable compositions. This causes problems such as in case of reproducing precise images if the operation is disturbed even slightly by vibrations and images having good quality are not reproduced; the energy irradiation amount—intensity of the light source for exposure must be increased and hence it is necessary to release large amounts of generated heat, and further the films or layers of the composition are liable to be deformed and/or denatured by the heat.

SUMMARY OF THE INVENTION

Accordingly one object of this invention is to provide high-sensitive photopolymerizable compositions.

Another object of this invention is to provide photopolymerizable compositions containing a polymerizable ethylenically unsaturated compound together with a photopolymerization initiator for increasing the photopolymerization speed of the photopolymerizable compositions.

As the result of various investigations directed to attaining the above-described objects of this invention, it has been discovered that some specific photopolymerization initiators greatly increase the photopolymerization speed of polymerizable ethylenically unsaturated compounds.

That is, the invention relates to a photopolymerizable composition containing a polymerizable ethylenically unsaturated compound and a photopolymerization initiator represented by general formula (I):

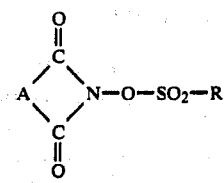

wherein A represents an arylene group, a substituted arylene group, an alkylene group, a substituted alkylene group, an alkylene group, a substituted alkenylene group and R represents an alkyl group, a substituted alkyl group, an aryl group, or a substituted aryl group; together with, if necessary, a linear organic high molecular weight polymer and further, if necessary, a sensitizer.

DETAILED DESCRIPTION OF THE INVENTION

The polymerizable ethylenically unsaturated compound used in this invention contains at least two polymerizable ethylenically unsaturated groups per molecule. Practical examples are esters of acrylic acid or methacrylic acid and polyols, bisacrylamides and vinylurethane compounds having two or more polymerizable vinyl groups per molecule.

Typical acrylic and methacrylic acid esters are esters of polyols having at least two aliphatic hydroxy groups, preferably having 2 to 5 aliphatic hydroxy groups and having from 2 to 12 carbon atoms. There are, for example, diols such as ethylene glycol, propylene glycol, diethylene glycol, triethylene glycol, 1,4-butane diol, 1,5-pentane diol, polycyclohexane oxide, polystyrene oxide, cyclohexane diol, xylylene diol, di-(β-hydroxyethoxy)benzene; polyols such as glycerine, diglycerine, trimethylolpropane, triethylolpropane, pentaerythritol, and the like. Suitable acrylates or methacrylates of polyols are compounds such as diethylene glycol diacrylate, diethylene glycol dimethacrylate, triethylene glycol diacrylate, triethylene glycol dimethacrylate, trimethylolpropane triacrylate, trimethylolpropane trimethacrylate, pentaerythritol triacrylate, etc., and are described in detail in U.S. Pat. Nos. 2,760,863, 2,791,504, 3,060,023 and 3,870,524.

The bisacrylamide can be alkylene or arylene but the alkylene bisacrylamide is preferred. Examples are methylene-bis-acrylamide, ethylene-bis-acrylamide, propylene-bis-acrylamide, butylene-bis-acrylamide, pentamethylene-bis-acrylamide, hexamethylene-bis-acrylamide, heptamethylene-bis-acrylamide, octamethylene-bis-acrylamide, N,N',N''-tris-acrylamide from diethylene triamine, xylene bisacrylamide, etc., as described in U.S. Pat. Nos. 2,927,022 and 3,486,903 and British Pat. No. 875,378, etc.; the corresponding methacrylamides and acrylamides and methacrylamides derived from polyamides and other diamines, said amines may have 2 to 18 carbon atoms, be branched and contain —O— or —NH— or —NR (R=lower alkyl) groups in the molecule chain or aliphatic or aromatic rings.

The vinyl urethane compounds can be prepared by reacting a polyisocyanate compound having two or more isocyanate groups per molecule with a vinyl monomer containing a hydroxy group shown by general formula (II):

$$CH_2=C(R_1)COOCH_2CH(R_2)OH \quad \text{(II)}$$

wherein $R_1$ and $R_2$ each represents H or $CH_3$ are described in Japanese Pat. Publication No. 41708/73. The polyisocyanate used in making the vinylurethane compounds may have two or more isocyanate groups in the molecule and preferably has about 6 to 20 carbon atoms. Examples of the polyisocyanate are hexamethylenediisocyanate, octamethylenediisocyanate, xylylenediisocyanate, tolylene-2,4-diisocyanate, 1,5-naphthalenediisocyanate, 4,4'-diphenylmethanediisocyanate and triphenylmethanetriisocyanate.

Other examples of the compounds having two or more polymerizable ethylenically unsaturated groups per molecule and useful as the ethylenically unsaturated compound are polyester polyacrylates, polyester polymethacrylates, epoxy acrylates, epoxy methacrylates, etc., described in Japanese Pat. Application (OPI) Nos. 32003/73 (the term "OPI" as used herein refers to a "published unexamined Japanese patent application") and 30504/73 and U.S. Pat. No. 3,732,107.

The photopolymerization initiators which are characteristic of the photopolymerizable compositions of this invention can be prepared by the method described in, for example, L. Bauer, et al., *Journal of Organic Chemistry*, 24, 1293 (1959) under basic conditions using the compound represented by general formula (III):

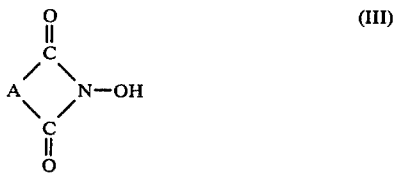

wherein A is defined as in formula (I); prepared according to the method described in G. F. Jauber, *Berichte der Deutschen Chemischen Gesellschaft*, Vol. 28, pages 360–364 (1895); the method described in D. E. Ames, et al., *Journal of Chemistry Society*, 3518–3521 (1955); or the method described in M. A. Stolberg, et al., *Journal of the American Chemical Society*, 79, 2615–2617 (1957); and an organic sulfonic acid chloride represented by the formula:

$$R-SO_2Cl$$

wherein R has the same meaning as in formula (I). The reaction of the compound of formula (III) with the sulfonic acid chloride proceeds under basic conditions using water or an organic solvent as a solvent. When an organic solvent is used, organic solvents other than alcohols and phenols are preferred (for example, acetone, methyl ethyl ketone, tetrahydrofuran, 1,4-dioxane). Amines such as diethylamine, triethylamine, pyridine, etc., are preferred as the base. When water is used as the solvent, a water-soluble inorganic base (for example, sodium carbonate, potassium carbonate, sodium hydroxide, potassium hydroxide) is preferred. A reaction temperature of about 0° to 50° C. is preferred for both water and the organic solvent. The compound of formula (III) and the sulfonic acid chloride react in about equal moles and the base is preferably used in an equivalent to three times equivalent amount based on the compound of formula (III).

The arylene group A in formula (I) is preferably a monocyclic or bicyclic arylene group such as a phenylene group, a naphthylene group, etc., more practically an o-phenylene group, a 1,8-naphthylene group, a 2,3-naphthylene group, etc. The substituted arylene group is one described above having a substituent such as a halogen atom (e.g., a chlorine, bromine, etc.), a nitro group, an acetylamino group, etc., and is practically a bromophenylene group, a chlorophenylene group, a nitrophenylene group, an acetylaminophenylene group, a bromonaphthylene group, a chloronaphthylene group, a nitronaphthylene group, etc.

The alkylene group A is a straight chain, branched chain, or cyclic alkylene group having preferably 1 to about 6 carbon atoms such as, for example, a methylene group, an ethylene group, a propylene group, a cyclobutylene group, a cyclohexylene group, etc. The alkylene group can bear one or more substituents such as, for example, a phenyl group, a naphthyl group or an alkyl group, preferably a straight chain alkyl group having 1 to 4 carbon atoms, for example, a methyl group, an ethyl group, an n-propyl group and an n-butyl group. Practical examples of substituted alkylene groups are a phenylethylene group, a diphenylethylene group, etc.

The alkenylene group A preferably has 2 to 4 carbon atoms, may be a straight chain, branched chain, or cyclic alkenylene and preferably is a straight chain alkenylene, and is practically a vinylidene group, a butenylene group, etc. Furthermore, the alkenylene group may be substituted by an aryl group such as a phenyl group or a lower alkyl group preferably an alkyl group having 1 to 2 carbon atoms (e.g., a methyl group or an ethyl group) and is practically a phenylvinylidene group, a diphenylvinylidene group, etc.

On the other hand, the alkyl group R in formula (I) is a straight chain, branched chain or cyclic alkyl group (preferably a straight chain alkyl group) preferably having 1 to 18 carbon atoms. For example, there are a methyl group, an ethyl group, a butyl group, a hexyl group, an octyl group, a dodecyl group, a hexadecyl group, etc. Also, the substituted alkyl group R is one described above having a halogen atom such as a chlorine, bromine, or fluorine atom, etc., or an alkoxy group having 1 to 4 and preferably 1 or 2 carbon atoms such as a methoxy group, etc., as the substituent. Practical examples are a 2-chloroethyl group, a 2-methoxyethyl group, etc.

The aryl group R is preferably a monocyclic or bicyclic aryl group having 6 to 12 carbon atoms such as, for example, a phenyl group, a naphthyl group, etc. The aryl group may be substituted by an alkyl group having 1 or 2 carbon atoms such as a methyl group or an ethyl group; an alkoxy group having 1 or 2 carbon atoms such as a methoxy group or an ethoxy group, or a halogen atom such as a chlorine atom, etc. Practical examples are a methylphenyl group, a dimethylphenyl group, a methoxyphenyl group, a chlorophenyl group, a methoxynaphthyl group, etc.

The compounds having the structures shown in Table 1 are particularly useful as the photopolymerization initiators used in this invention.

TABLE 1

| Compound No. | Formula |
|---|---|
| I-1 | Phthalimide-N-O-SO₂—CH₃ |
| I-2 | Phthalimide-N-O-SO₂—CH₂—CH₃ |
| I-3 | Phthalimide-N-O-SO₂—(CH₂)₃—CH₃ |
| I-4 | Phthalimide-N-O-SO₂—(CH₂)₁₅—CH₃ |
| I-5 | Phthalimide-N-O-SO₂—CH₂·CH₂·Cl |
| I-6 | Phthalimide-N-O-SO₂·CH₂·CH₂—O—CH₃ |
| I-7 | Phthalimide-N-O-SO₂—C₆H₅ |
| I-8 | Phthalimide-N-O-SO₂—C₆H₄—CH₃ (p) |
| I-9 | Phthalimide-N-O-SO₂—C₆H₄—O—CH₃ (p) |
| I-10 | Phthalimide-N-O-SO₂—(2,5-dimethylphenyl) |
| I-11 | Phthalimide-N-O-SO₂—C₆H₄—Cl (p) |
| I-12 | Phthalimide-N-O-SO₂—(1-naphthyl) |
| I-13 | Phthalimide-N-O-SO₂—(4-methoxy-1-naphthyl) |
| I-14 | Succinimide-N-O-SO₂—CH₂—CH₃ |
| I-15 | Succinimide-N-O-SO₂—C₆H₅ |
| I-16 | (3-phenyl-succinimide)-N-O-SO₂—C₆H₅ |
| I-17 | Maleimide-N-O-SO₂—CH₂—CH₃ |
| I-18 | Maleimide-N-O-SO₂—C₆H₅ |

TABLE 1-continued

| Compound No. | Formula |
|---|---|
| I-19 | (phthalimide-like structure with phenyl-C(=O)-C=CH-C(=O)-N-O-SO₂-phenyl) |
| I-20 | 1,8-naphthalimide-N-O-SO$_2$-CH$_2$-CH$_3$ |
| I-21 | 1,8-naphthalimide-N-O-SO$_2$-(CH$_2$)$_{15}$-CH$_3$ |
| I-22 | 1,8-naphthalimide-N-O-SO$_2$-phenyl |
| I-23 | 1,8-naphthalimide-N-O-SO$_2$-C$_6$H$_4$-CH$_3$ |

Below are several examples of preparing some compounds of formula (I).

SYNTHESIS EXAMPLE 1

Preparation of N-hydroxyphthalimidomethanesulfonic acid ester (Compound I-1)

To a mixture of 3.3 g of N-hydroxyphthalimide and 2.3 g of methanesulfonyl chloride was added 40 ml of acetone and then 2.0 g of triethylamine was added dropwise to the resultant mixture at room temperature (about 20° C.) with stirring over a 10 minute period. The mixture was further stirred for 1 hour at room temperature, added to 200 g of ice water, and precipitates formed were collected and recrystallized from a mixture of benzene and ethanol, thereby 3.1 g of N-hydroxyphthalimidomethanesulfonic acid ester (melting point 168°–170° C.) was obtained.

SYNTHESIS EXAMPLE 2

Preparation of N-hydroxyimidoethanesulfonic acid ester (Compound I-2)

To a mixture of 3.3 g of N-hydroxyphthalimide and 2.6 g of ethanesulfonyl chloride was added 40 ml of acetone and the mixture was treated as in Synthesis Example 1 to provide 3.2 g of N-hydroxyimidoethanesulfonic acid ester (melting point 172°–174° C.).

SYNTHESIS EXAMPLE 3

Preparation of N-hydroxyphthalimidobenzenesulfonic acid ester (Compound I-7)

To 30 g of an aqueous solution of 5% by weight sodium carbonate was added 3.3 g of N-hydroxyphthalimide and then while stirring the mixture at room temperature, 3.5 g of benzenesulfonyl chloride was added dropwise to the mixture over a 10 minute period. Furthermore, after stirring the resultant mixture for 1 hour at room temperature, precipitates formed were collected and recrystallized from a mixture of benzene and ethanol to provide 3.5 g of N-hydroxyphthalimidobenzenesulfonic acid ester (melting point 190°–192° C.).

SYNTHESIS EXAMPLE 4

Preparation of N-hydroxy-1,8-naphthalimidoethanesulfonic acid ester (Compound I-20)

To 400 g of an aqueous solution of 3% by weight sodium carbonate were added 24.0 g of 1,8-naphthalic acid anhydride and 10.0 g of hydroxylamine hydrochloride and they were reacted for 2 hours at 90° C. Then, 200 g of an aqueous solution of 10% by weight sodium carbonate was added to the mixture, after filtering away insoluble materials, 100 ml of concentrated hydrochloric acid was added to the mixture, and precipitates formed were collected and recrystallized from ethanol to provide N-hydroxy-1,8-naphthalimide.

To 10 g of an aqueous solution of 5% by weight sodium carbonate was added 1.5 g of N-hydroxy-1,8-naphthalimide thus prepared and while stirring the mixture at room temperature, 1.0 g of ethanesulfonyl chloride was added dropwise to the mixture over a 5 minute period. After further stirring the resultant mixture for 1 hour at room temperature, precipitates formed were collected and recrystallized from a mixture of benzene and ethanol to provide 1.4 g of N-hydroxy-1,8-naphthalimidoethanesulfinic acid ester (melting point 159°–162° C.).

SYNTHESIS EXAMPLE 5

Preparation of N-hydroxy-1,8-naphthalimidobenzenesulfonic acid ester (Compound I-22)

To 10 g of an aqueous solution of 5% by weight sodium carbonate was added 1.1 g of N-hydroxy-1,8-naphthalimide prepared in Synthesis Example 4 as the intermediate product and while stirring the mixture at room temperature, 1.2 g of benzenesulfonyl chloride was added dropwise to the mixture over a 5 minute period. After further stirring the resultant mixture for 1 hour at room temperature, precipitates formed were collected and recrystallized from a mixture of benzene and ethanol to provide 1.1 g of N-hydroxy-1,8-naphthalimidobenzenesulfonic acid ester (melting point 215°–217° C.).

Other compounds of formula (I) can be prepared in a manner similar to the above.

The amount of the photopolymerization initiator used in this invention is usually very small and the use of an excessive amount causes undesirable results such as blocking effective radiation, etc. Thus, the amount of the photopolymerization initiator of formula (I) used in this invention is usually about 0.1 to 20% by weight, preferably about 1 to 10% by weight based on the amount of the ethylenically unsaturated compound.

The linear organic high molecular weight polymer used in this invention are found in many conventional photopolymerizable compositions and must be compatible with the polymerizable ethylenically unsaturated compound. Typical examples are the binders disclosed in U.S. Pat. Nos. 3,458,311, 3,804,631, 3,930,865 and 4,147,549. The molecular weight for these polymers varies depending on the kind of the polymer, but is generally about 5,000 to 2,000,000 and preferably about 10,000 to 1,000,000. Any linear organic high molecular weight polymer that is compatible with the ethylenically unsaturated monomer can be used in the present invention, and water-soluble or weak aqueous alkali-solution soluble polymers are preferred.

The linear organic high molecular weight polymer is used not only as the film-forming agent of the photopolymerizable composition of this invention but is also selected to enable the use of a water developer, a weak aqueous alkali developer, or an organic solvent developer. For example, when a water-soluble linear high molecular weight polymer such as a polymer having a carboxylic acid group or a sulfonic acid group in a side chain thereof (e.g., polymers in which methacrylic acid, acrylic acid, itaconic acid or 2-acrylamido-2-methyl-propane sulfonic acid is a comonomer) is used, water development is applicable. As such water soluble high molecular weight polymers, there are addition polymers having carboxylic acid groups in the side chain thereof, such as methacrylic acid copolymers, acrylic acid copolymers, itaconic acid copolymers, crotonic acid copolymers, partially esterificated maleic acid copolymers, etc., and acid cellulose derivatives having carboxylic acid groups in the side chains thereof. Polymers prepared by reacting a cyclic acid anhydride with addition polymerized polymers containing hydroxy groups can also be useful as the linear organic polymers (for example, reaction products of an aliphatic cyclic acid anhydride such as succinic anhydride, glutaric anhydride, hexahydrophthalic anhydride, maleic anhydride, itaconic anhydride, an aromatic cyclic acid anhydride such as phthalic anhydride, trimellitic acid anhydride, 1,8-naphthalic anhydride and an addition polymer containing hydroxy groups such as homopolymers or copolymers of 2-hydroxyethylmethacrylate, 2-hydroxyethylacrylate, 2-hydroxypropylmethacrylate, 2-hydroxypropylacrylate, N-methylolacrylamide, p-hydroxymethacrylanilide, N-(5-hydroxy-α-naphthyl)-methacrylamide).

Other examples of the water-soluble linear organic high molecular weight polymers used in this invention are polyvinyl pyrrolidone, polyethylene oxide, etc. Furthermore, alcohol-soluble nylons and the polyethers of 2,2-bis(4-hydroxyphenyl)propane and epichlorohydrin are useful for increasing the strength of the hardened films or layers in this invention.

These linear organic high molecular weight polymers may be incorporated in the photopolymerizable composition in almost any desired amount but if the amount is over about 90% by weight of the composition, the results obtained are undesirable from the standpoint of the image strength, etc.

When a sensitizer is further incorporated in the photopolymerizable composition of this invention, a sensitizer which can increase the photopolymerization speed of the photopolymerizable composition can be used together with the photopolymerization initiator shown by formula (I). Practical examples of such sensitizers are carbonyl compounds such as benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, p-(dimethylamino)phenylstyryl ketone, benzil, dibenzalacetone, p-(dimethylamino)phenyl-p-methylstyryl ketone, benzophenone, p-(dimethylamino)benzophenone (or Michler's ketone), p-(diethylamino)benzophenone, benzanthrone, etc. In particular, Michler's ketone is most preferred.

Furthermore, preferred examples of the sensitizers used in this invention are the compounds of the formula (IV) described in U.S. Pat. No. 3,870,524:

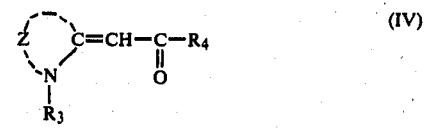

wherein $R_3$ represents an alkyl group and preferably a straight chain alkyl group having 1 to 4 carbon atoms (e.g., a methyl group, an ethyl group, a propyl group, etc.) or a substituted alkyl group (e.g., a 2-hydroxyethyl group, a 2-methoxyethyl group, a carboxymethyl group, a 2-carboxyethyl group, etc.), $R_4$ represents an alkyl group, preferably a straight chain alkyl group having 1 to 6 carbon atoms (e.g., a methyl group, an ethyl group, etc.) or a substituted or unsubstituted, mono- or bicyclic aryl group having 6 to 12 carbon atoms (e.g., a phenyl group, a p-hydroxyphenyl group, a naphthyl group, a thienyl group, etc.), and Z represents the non-metallic atoms necessary for forming a nitrogen-containing heterocyclic ring usually occurring in cyanine dyes such as benzothiazoles (e.g., benzothiazole, 5-chlorobenzothiazole, 6-chlorobenzothiazole, etc.), naphthothiazoles (e.g., α-naphthothiazole, β-naphthothiazole, etc.), benzoselenazoles (e.g., benzoselenazole, 5-chlorobenzoselenazole, 6-methoxybenzoselenazole, etc.), naphthoselenazoles (e.g., α-naphthoselenazole, β-naphthoselenazole, etc.), benzoxazoles (e.g., benzoxazole, 5-methylbenzoxazole, 5-phenylbenzoxazole, etc.), naphthoxazoles (e.g., α-naphthoxazole, β-naphthoxazole, etc.), and the like. The aryl group $R_4$ may be substituted with, for example, an alkyl group having 1 to 2 carbon atoms (e.g., a methyl group, an ethyl group), an alkoxy group having 1 to 2 carbon atoms (e.g., a methoxy group, an ethoxy group), a halogen atom (e.g., a chlorine atom, a bromine atom), a hydroxy group, a carboxy group. The alkyl group $R_3$ may be substituted by, e.g., a hydroxy group, an alkoxy group (preferably an alkoxy group having 1 to 2 carbon atoms), and a carboxy group.

Many compounds of formula (IV) having various combinations of Z, $R_3$ and $R_4$ are known and hence the sensitizers used in this invention may be properly adjusted using these known materials. The amount of the sensitizer used in the invention is usually very small and the use of an excessive amount causes undesirable results such as shielding of actinic light, etc. The amount of the sensitizer used in this invention is usually about 0.01 to 20% by weight, preferably about 1 to 10% by weight based on the amount of the ethylenically unsaturated compound used.

Furthermore, it is preferred to add a thermal polymerization inhibitor to the photopolymerizable composition in an amount of about 0.005 to 5% by weight of the amount of the ethylenically unsaturated compound to prevent the occurrence of the unnecessary thermal polymerization of the polymerizable ethylenically unsaturated compound during the production or preservation of the photopolymerizable composition of this invention. Examples of suitable thermal polymerization inhibitors are hydroquinone, p-methoxyphenol, di-t-butyl-p-cresol, pyrogallol, t-butyl-catechol, benzoquinone, 4,4'-thiobis(3-methyl-6-t-butylphenol), 2,2'-methylenebis(4-methyl-6-t-butylphenol), 2-mercaptobenzimidazole, N-nitrosophenylhydroxylamine primary selium salt, etc.

Suitable support materials can be chosen from among a variety of meterials which do not directly chemically react with the coating composition. Such support materials include fiber base materials such as paper, polyethylene-coated paper, polypropylene-coated paper, parchment, cloth, etc.; sheets and foils of such metals as aluminum particularly grained aluminum, anodized aluminum or grained and anodized aluminum, copper, magnesium, zinc, etc.; glass and glass coated with such metals as chromium, chromium alloys, steel, silver, gold, platinum, etc.; synthetic resin and polymeric materials such as poly(alkyl acrylates), e.g., poly(methyl methacrylate), polyester film base—e.g., poly(ethylene terephthalate), poly(vinyl acetals), polyamides—e.g., nylon and cellulose ester film base—e.g., cellulose acetate, cellulose nitrate, cellulose ester with a hydrolyzed surface, cellulose acetate propionate, cellulose acetate butyrate and the like.

Light sources which may be used in exposing the photopolymerizable composition of the present invention include broad spectrum light sources, filtered or unfiltered, including xenon or carbon arcs, narrow spectrum sources such as mercury lamps which emit within low (UV) to medium (visible light) wavelengths, and laser sources.

Also, as the case may be, dyes or pigments may be added to the composition for coloring and further inorganic fillers may be added for improving the properties of the hardened films or layers of the compositions.

The invention will be further explained by the following examples.

EXAMPLES 1-4

An aluminum sheet which was grained by a nylon brush and treated with silicate was coated with the following photosensitive coating composition using a rotary coating machine and dried for 3 minutes at 100° C. to form a photosensitive layer, thereby a photosensitive plate was prepared.

| Photosensitive Coating Composition: | |
|---|---|
| Copolymer of methyl methacrylate and methacrylic acid (85/15 by mol) (intrinsic viscosity in MEK at 30° C. 0.166) | 62 g |
| Trimethylolpropane Triacrylate | 38 g |
| Compound of Formula (I) (Table 2) | 2.0 g |
| Triphenyl Phosphate | 10 g |
| Ethyl Cellosolve | 650 ml |
| Methylene Chloride | 350 ml |

The photosensitive plate was exposed through a step wedge (density step difference of 0.15 and density step number of 0–15 steps) to a light source (a metal halide lamp of 0.5 kw) at a distance of 50 cm from the light source for 10 minutes using a vacuum printing frame and thereafter developed using a developer having the following composition.

| Developer: | |
|---|---|
| Sodium Tertiary Phosphate | 25 g |
| Sodium Primary Phosphate | 5 g |
| Butyl Cellosolve | 70 g |
| Active Agent | 2 ml |
| Water | 1 l |

The maximum step numbers on the step wedge corresponding to the reproduced images are shown in Table 2 as the sensitivity. A higher step number indicates a higher sensitivity. Also, the sensitivity in case of adding no photopolymerization initiator of formula (I) is shown in Table 2 as Comparison Example 1.

TABLE 2

| Example | Compound of Formula (I) | Maximum Step Number |
|---|---|---|
| 1 | I-1 | 6 |
| 2 | I-10 | 6 |
| 3 | I-20 | 5 |
| 4 | I-22 | 5 |
| Comparison Example 1 | — | 0 |

As is shown in Table 2, when the photopolymerization initiators of formula (I) are used, higher sensitivities than the comparison were obtained, thereby the desired effect of this invention is obtained.

EXAMPLES 5-14

In coating compositions prepared by the same manner as in Examples 1 to 4 was dissolved 1.6 g of Michler's ketone and photosensitive plates were prepared using the compositions as in Examples 1 to 4.

Each of the photosensitive plates was exposed through a step wedge for 3 minutes using a Plano PS printer A3 (made by Fuji Photo Film Co., Ltd.) and then developed using the developer having the same composition as in Examples 1 to 4. The maximum step number of the step wedge corresponding to the reproduced image is shown in Table 3 as the sensitivity of each sample. Also, the sensitivity using Michler's ketone alone is shown in Table 3 as Comparison Example 2.

TABLE 3

| Example | Compound of Formula (I) | Maximum Step Number |
|---|---|---|
| 5 | I-1 | 13 |
| 6 | I-2 | 14 |
| 7 | I-3 | 14 |
| 8 | I-7 | 10 |
| 9 | I-8 | 10 |
| 10 | I-9 | 9 |
| 11 | I-10 | 9 |
| 12 | I-20 | 7 |
| 13 | I-21 | 7 |

TABLE 3-continued

| Example | Compound of Formula (I) | Maximum Step Number |
| --- | --- | --- |
| 14 | I-22 | 8 |
| Comparison Example 2 | — | 2 |

As is shown in Table 3, when the photopolymerization initiators of formula (I) are used together with Michler's ketone as a sensitizer, the sensitivity increases greatly as compared with the case of using Michler's ketone alone.

EXAMPLES 15–31

In the photosensitive compositions prepared in the same manner as in Examples 1 to 4 was dissolved 2.0 g of the compound of formula (IV) as a sensitizer and then photosensitive plates were prepared in the same manner as in Examples 1 to 4.

Each of the photosensitive plates was exposed through a step wedge for 3 minutes using Plano PS Printer A3 (made by Fuji Photo Film Co.) and then developed using the developer having the same composition as in Examples 1 to 4. The compounds of formula (IV) used in these examples are shown in Table 4. The sensitivity of each sample is shown in Table 5 as the maximum step number of the step wedge. Also, the sensitivity in case of using the compounds of formula (IV) solely are shown in Table 5 as Comparison Examples 3 to 8.

TABLE 4

| Compound No. | Formula |
| --- | --- |
| IV-1 | 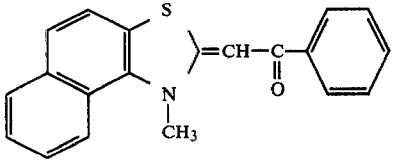 |
| IV-2 | 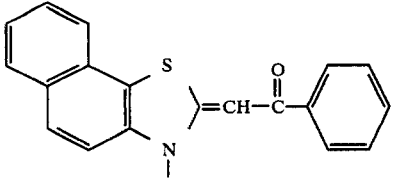 |
| IV-3 | 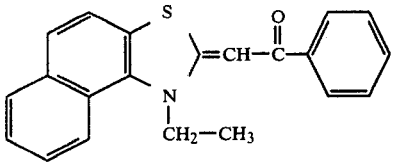 |
| IV-4 | 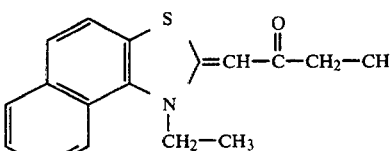 |
| IV-5 | (structure with Cl-substituted benzene, S, N-CH₂-CH₃, =CH-C(=O)-phenyl-O-CH₃) |
| IV-6 | (structure with naphthalene, S, N-CH₂-CH₃, =CH-C(=O)-thienyl) |

TABLE 5

| Comparison Example | Compound of Formula (I) | Compound of Formula (IV) | Maximum Step Number |
| --- | --- | --- | --- |
| 3 | — | IV-1 | 5 |
| 4 | — | IV-2 | 2 |
| 5 | — | IV-3 | 5 |
| 6 | — | IV-4 | 2 |
| 7 | — | IV-5 | 2 |
| 8 | — | IV-6 | 3 |
| Example | | | |
| 15 | I-3 | IV-1 | 14 |
| 16 | I-3 | IV-2 | 10 |
| 17 | I-3 | IV-3 | 13 |
| 18 | I-3 | IV-4 | 7 |
| 19 | I-3 | IV-5 | 10 |
| 20 | I-3 | IV-6 | 11 |
| 21 | I-1 | IV-1 | 14 |
| 22 | I-2 | IV-1 | 14 |
| 23 | I-3 | IV-1 | 14 |
| 24 | I-4 | IV-1 | 12 |
| 25 | I-7 | IV-1 | 12 |
| 26 | I-8 | IV-1 | 12 |
| 27 | I-9 | IV-1 | 11 |
| 28 | I-10 | IV-1 | 11 |
| 29 | I-20 | IV-1 | 10 |
| 30 | I-21 | IV-1 | 10 |
| 31 | I-22 | IV-1 | 11 |

As is clear from Table 5, as compared with the use of the compounds of formula (IV) alone, the sensitivity is increased greatly by combining the compounds of formula (IV) with the compounds of formula (I) and in the latter case the desired effects of this invention are obtained.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising a monomer having at least two ethylenically unsaturated groups capable of being photopolymerized by actinic irradiation and a photopolymerization initiator represented by the formula:

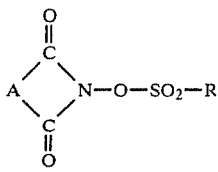

wherein A represents an arylene group, a substituted arylene group, an alkylene group, a substituted alkylene group, an alkenylene group, or a substituted alkenylene group and R represents an alkyl group, a substituted alkyl group, an aryl group, or a substituted aryl group.

2. The photopolymerizable composition of claim 1, wherein the proportion of the photopolymerization initiator is from about 0.01% by weight to 20% by weight based on the amount of the monomer having at least two ethylenically unsaturated groups.

3. The photopolymerizable composition of claim 1, wherein said monomer having at least two ethylenically unsaturated groups is an acrylic acid ester or methacrylic acid ester of a polyol.

4. The photopolymerizable composition of claim 1, wherein said monomer having at least two ethylenically unsaturated groups is a bisacrylamide.

5. The photopolymerizable composition of claim 1, wherein said monomer having at least two ethylenically unsaturated groups is a vinylurethane compound prepared by reacting a polyisocyanate compound having at least two isocyanate groups with a vinyl monomer represented by the formula:

$$CH_2=C(R_1)COOCH_2CH(R_2)OH$$

wherein $R_1$ and $R_2$ each represents a hydrogen atom or a methyl group.

6. The photopolymerizable composition of claim 1, wherein said monomer having at least two ethylenically unsaturated groups is a polyester polyacrylate, a polyester polymethacrylate, an epoxy acrylate or an epoxy methacrylate.

7. The photopolymerizable composition of claim 1, wherein A represents an o-phenylene group, a 1,8-naphthylene group, a 2,3-naphthylene group, or one of said groups substituted by a bromine atom, a chlorine atom, a nitro group, or an acetylamino group.

8. The photopolymerizable composition of claim 1, wherein A represents a methylene group, an ethylene group, a propylene group, a cyclobutylene group, a cyclohexylene group, or a phenylethylene group.

9. The photopolymerizable composition of claim 1, wherein A represents a vinylidene group, a butenylene group, a phenylvinylidene group, or a diphenylvinylidene group.

10. The photopolymerizable composition of claim 1 additionally comprising a linear organic high molecular weight polymer.

11. The photopolymerizable composition of claim 1, which is developable by water, a weak aqueous alkali solution, or an organic solvent.

12. The photopolymerizable composition of claim 10, wherein said linear organic high molecular weight polymer is a polymer having carboxylic acid groups in the side chains thereof, a reaction product of a cyclic acid anhydride and an addition polymer containing hydroxy groups, an alcohol soluble nylon, a polyether of 2,2-bis-(4-hydroxyphenyl)propane and epichlorohydrin, polyvinyl pyrrolidone, or polyethylene oxide.

13. The photopolymerizable composition of claim 1 additionally comprising a sensitizer capable of increasing the photopolymerization speed of the composition.

14. The photopolymerizable composition of claim 13, wherein said sensitizer is selected from the group consisting of benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, p-(dimethylamino)phenylstyryl ketone, benzil, dibenzalacetone, p-(dimethylamino)phenyl-p-methylstyryl ketone, benzophenone, p-(dimethylamino)benzophenone (or Michler's ketone), p-(diethylamino)benzophenone, and benzanthrone.

15. The photopolymerizable composition of claim 13, wherein said sensitizer is represented by the formula (IV):

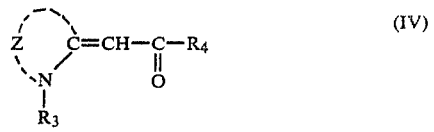

wherein $R_3$ represents an alkyl group or a substituted alkyl group, $R_4$ represents an alkyl group, or an aryl group and Z represents the non-metallic atoms necessary to complete a nitrogen-containing heterocyclic ring such as usually occurs in cyanine dyes.

16. The photopolymerizable composition of claim 1, which additionally comprises a thermal polymerization inhibitor.

17. A photosensitive material comprising a support having thereon a layer of a photopolymerizable composition comprising a monomer having at least two ethylenically unsaturated groups capable of being photopolymerized by actinic irradiation and a photopolymerization initiator represented by the formula:

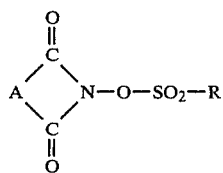

wherein A represents an arylene group, a substituted arylene group, an alkylene group, a substituted alkylene group, an alkenylene group, or a substituted alkenylene group and R represents an alkyl group, a substituted alkyl group, an aryl group, or a substituted aryl group.

18. The photosensitive material of claim 17, wherein the proportion of the photopolymerization initiator is from about 0.01% by weight to 20% by weight based on the amount of the monomer having at least two ethylenically unsaturated groups.

19. The photosensitive material of claim 17, wherein said monomer having at least two ethylenically unsaturated groups is an acrylic acid ester or methacrylic acid ester of a polyol.

20. The photosensitive material of claim 17, wherein said monomer having at least two ethylenically unsaturated groups is a bisacrylamide.

21. The photosensitive material of claim 17, wherein said monomer having at least two ethylenically unsaturated groups is a vinylurethane compound prepared by reacting a polyisocyanate compound having at least two isocyanate groups with a vinyl monomer represented by the formula:

$$CH_2=C(R_1)COOCH_2CH(R_2)OH$$

wherein $R_1$ and $R_2$ each represents a hydrogen atom or a methyl group.

22. The photosensitive material of claim 17, wherein said monomer having at least two ethylenically unsaturated groups is a polyester polyacrylate, a polyester polymethacrylate, an epoxy acrylate or an epoxy methacrylate.

23. The photosensitive material of claim 17, wherein A represents an o-phenylene group, a 1,8-naphthylene group, a 2,3-naphthylene group, or one of said groups substituted by a bromine atom, a chlorine atom, a nitro group, or an acetylamino group.

24. The photosensitive material of claim 17, wherein A represents a methylene group, an ethylene group, a propylene group, a cyclobutylene group, a cyclohexylene group, or a phenylethylene group.

25. The photosensitive material of claim 17, wherein A represents a vinylidene group, a butenylene group, a phenyvinylidene group, or a diphenylvinylidene group.

26. The photosensitive material of claim 17 additionally comprising a linear organic high molecular weight polymer.

27. The photosensitive material of claim 17, which is developable by water, a weak aqueous alkali, or an organic solvent.

28. The photosensitive material of claim 26, wherein said linear organic high molecular weight polymer is a polymer having carboxylic acid groups in the side chains thereof, a reaction product of a cyclic acid anhydride and an addition polymer containing hydroxy groups, an alcohol soluble nylon, a polyether of 2,2-bis(4-hydroxyphenyl)propane and epichlorohydrin, polyvinyl pyrrolidone, or polyethylene oxide.

29. The photosensitive material of claim 17 additionally comprising a sensitizer capable of increasing the photopolymerization speed of the composition.

30. The photosensitive material of claim 29, wherein said sensitizer is selected from the group consisting of benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, p-(dimethylamino)phenylstyryl ketone, benzil, dibenzalacetone, p-(dimethylamino)phenyl-p-methylstyryl ketone, benzophenone, p-(dimethylamino)benzophenone (or Michler's ketone), p-(diethylamino)benzophenone, and benzanthrone.

31. The photosensitive material of claim 29, wherein said sensitizer is represented by formula (IV):

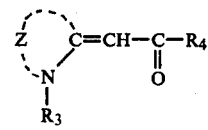

(IV)

wherein $R_3$ represents an alkyl group or a substituted alkyl group, $R_4$ represents an alkyl group or an aryl group and Z represents the non-metallic atoms necessary to complete a nitrogen-containing heterocyclic ring such as usually occurs in cyanine dyes.

32. The photosensitive material of claim 17, which additionally comprises a thermal polymerization inhibitor.

33. In a photopolymerizable composition comprising a monomer having at least two ethylenically unsaturated groups, the improvement which comprises a photopolymerization initiator represented by the formula:

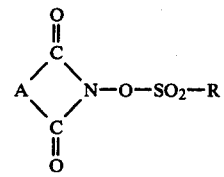

wherein A represents an arylene group, a substituted arylene group, an alkylene group, a substituted alkylene group, an alkenylene group, or a substituted alkenylene group and R represents an alkyl group, a substituted alkyl group, an aryl group, or a substituted aryl group.

* * * * *